United States Patent
Kang et al.

(10) Patent No.: US 11,949,372 B2
(45) Date of Patent: Apr. 2, 2024

(54) LUMINESCENT SOLAL CONCENTRATOR WITH PHOSPHOR-DOPED POLYMER RESIN

(71) Applicant: KOREA INSTITUTE OF SCIENCE AND TECHNOLOGY, Seoul (KR)

(72) Inventors: Gumin Kang, Seoul (KR); Hyungduk Ko, Seoul (KR); Ho Seong Jang, Seoul (KR); Cho-long Jung, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 17/056,412

(22) PCT Filed: May 28, 2020

(86) PCT No.: PCT/KR2020/006891
§ 371 (c)(1),
(2) Date: Nov. 17, 2020

(87) PCT Pub. No.: WO2021/235585
PCT Pub. Date: Nov. 25, 2021

(65) Prior Publication Data
US 2023/0103150 A1    Mar. 30, 2023

(30) Foreign Application Priority Data
May 22, 2020    (KR) .......................... 10-2020-0061634

(51) Int. Cl.
*H02S 40/22*    (2014.01)
(52) U.S. Cl.
CPC .................................. *H02S 40/22* (2014.12)
(58) Field of Classification Search
CPC ...... H02S 40/22; H01L 31/055; H01L 31/054
See application file for complete search history.

(56) References Cited

U.S. PATENT DOCUMENTS

| 2010/0139749 A1* | 6/2010 | Mapel ....................... C03C 4/12 136/255 |
| 2010/0243053 A1* | 9/2010 | Coe-Sullivan ...... H01L 31/0543 165/185 |

(Continued)

FOREIGN PATENT DOCUMENTS

| JP | 2016-131249 A | 7/2016 |
| JP | 6164258 B2 | 7/2017 |

(Continued)

OTHER PUBLICATIONS

Sadra Sadeghi et al., "Ecofriendly and Efficient Luminescent Solar Concentrators Based on Fluorescent Proteins," ACS Applied Materials & Interfaces, Feb. 2019, pp. 8710-8716, vol. 11, American Chemical Society.

*Primary Examiner* — Christina Chern
(74) *Attorney, Agent, or Firm* — CANTOR COLBURN LLP

(57) ABSTRACT

The present disclosure relates to a transparent luminescent solar concentrator (LSC). The LSC according to an embodiment of the present disclosure includes a polymer resin panel uniformly doped with phosphors. Accordingly, it is possible to greatly improve the transmittance and optical haze compared to the existing LSC manufactured by physically mixing or coating phosphors on the front side of the panel. In addition, it is possible to greatly improve the light collection efficiency of the LSC through the arrangement structure of the solar cells embedded in the polymer resin panel. The polymer resin panel according to an embodiment may be manufactured with flexibility or rigidity according to the purpose of use, and thus can be widely applied to curved structures, for example, building windows, automobile glasses and greenhouse roofs.

15 Claims, 16 Drawing Sheets

(56) References Cited

U.S. PATENT DOCUMENTS

| | | | |
|---|---|---|---|
| 2011/0240120 A1* | 10/2011 | Ronda | C09K 11/02 |
| | | | 252/301.36 |
| 2014/0130864 A1 | 5/2014 | Lunt et al. | |
| 2018/0248064 A1 | 8/2018 | Lunt et al. | |
| 2019/0326460 A1 | 10/2019 | Needell et al. | |
| 2020/0279693 A1 | 9/2020 | Moon et al. | |
| 2022/0190178 A1* | 6/2022 | Kang | H01L 31/02 |

FOREIGN PATENT DOCUMENTS

| | | | | |
|---|---|---|---|---|
| KR | 101569536 B1 | | 11/2015 | |
| KR | 10-2016-0136358 A | | 11/2016 | |
| KR | 102000772 B1 | | 7/2019 | |
| KR | 1020200049796 A | | 5/2020 | |
| KR | 102255573 B1 | * | 5/2021 | ......... H01L 31/0224 |
| WO | 2009024509 A2 | | 2/2009 | |
| WO | 2015/143038 A1 | | 9/2015 | |
| WO | 2018/148837 A1 | | 8/2018 | |
| WO | 2019053567 A1 | | 3/2019 | |

* cited by examiner

LUMINESCENT SOLAL CONCENTRATOR WITH PHOSPHOR-DOPED POLYMER RESIN

TECHNICAL FIELD

The present disclosure relates to a luminescent solar concentrator (LSC) that can be applied to windows or outer walls, and more particularly, to an LSC with a polymer resin panel uniformly doped with phosphors to improve transmittance and optical haze, and improved photoelectric conversion efficiency through the arrangement structure of solar cells, and a method for manufacturing the same.

DESCRIPTION OF GOVERNMENT-FUNDED RESEARCH AND DEVELOPMENT

This research is conducted by Korea Institute of Science and Technology, and funded by new renewable energy core technology development project (easy-to-expand transparent solar cell platform development, project number: 1415165293), Ministry of Trade, Industry and Energy.

BACKGROUND ART

A luminescent solar concentrator (LSC) is a device that can convert sunlight incident on a panel into electrical energy using solar cells. In general, the LSC includes a transparent panel and solar cells inserted into the panel, and absorbs and emits a specific wavelength range of light (for example, ultraviolet (UV) light) in the incident sunlight using a luminescent material coated on the panel, and the solar cells receive light emitted from the luminescent material and produce electrical energy.

The transparent polymer resin panel coated with the luminescent material that absorbs UV light and allows visible light to pass through may function as a window. This window has transmission properties and can produce electrical energy from sunlight, and thus it can be used in a wide range of applications, for example, buildings, vehicles and greenhouses, and is gaining attention as environmentally friendly next-generation functional windows.

However, since the transparent LSC cannot absorb visible light, the photoelectric conversion efficiency (i.e., the ratio of electrical energy produced from a predetermined amount of sunlight) is low, and the existing LSC involves a transparent polydimethylsiloxane (PDMS) panel physically mixed with a luminescent material or coated with a luminescent material on the front side of the panel, resulting in reduced transmittance and increased optical haze. In addition, it results in higher light scattering losses and lower light collection efficiency.

To solve this problem, some of earlier technologies manufacture LSCs by forming a channel in the polymer resin panel and filling the channel with a phosphor solution in liquid state. The phosphor solution filled in the channel emits light by sunlight and the light emitted from the phosphors is transmitted to the solar cells along a waveguide. This structure can improve the transmittance, compared to the existing coating-type LSC, but the phosphor solution leaks or the solvent is evaporated over time, which makes it difficult to maintain the light emission performance for a long time.

DISCLOSURE

Technical Problem

The present disclosure is intended to provide the structure of a luminescent solar concentrator (LSC) including a polymer resin panel uniformly doped with phosphors, thereby greatly improving the transmittance and optical haze compared to the existing LSC, and a method for manufacturing the LSC.

The present disclosure is further intended to improve the light collection efficiency of the LSC through the arrangement structure of solar cells.

Technical Solution

A luminescent solar concentrator according to an embodiment includes a polymer resin panel uniformly doped with phosphors, and a plurality of solar cells arranged within the polymer resin panel.

According to an embodiment, the phosphors may allow a first wavelength range of light to pass through, and absorb and emit a second wavelength range of light when sunlight is incident on the polymer resin panel.

According to an embodiment, the first wavelength range may include at least a wavelength range corresponding to visible light, and the second wavelength range may include at least a wavelength range corresponding to ultraviolet light.

According to an embodiment, the first wavelength range may include all wavelength ranges corresponding to visible light, and the polymer resin panel may be manufactured with transparency.

According to an embodiment, the plurality of solar cells may be configured to convert the second wavelength range of light absorbed and emitted by the phosphors into electrical energy.

According to an embodiment, each of the plurality of solar cells may be in the form of a bifacial panel, and the light emitted from the phosphors may be incident on each side of the solar cells.

According to an embodiment, the plurality of solar cells may be arranged such that each side is parallel to an incident direction of the sunlight incident on the polymer resin panel.

According to an embodiment, the plurality of solar cells may be arranged such that each side is perpendicular to an incident direction of the sunlight incident on the polymer resin panel.

According to an embodiment, the plurality of solar cells may be arranged such that each side is slanted with respect to an incident direction of the sunlight incident on the polymer resin panel, and two solar cells may be arranged such that each side faces each other at a slant.

According to an embodiment, the phosphors may include at least one material of a quantum dot, a nanocrystal or a dye that absorbs and emits ultraviolet light.

According to an embodiment, the polymer resin panel may be manufactured with flexibility by including a flexible material.

There is provided a window including the luminescent solar concentrator according to an embodiment to produce electrical energy from outdoor sunlight.

A method for manufacturing a luminescent solar concentrator according to an embodiment includes manufacturing a mold, manufacturing a polymer resin panel using the mold, uniformly doping the polymer resin panel with phosphors, and arranging a plurality of solar cells within the polymer resin panel.

According to an embodiment, the mold may be manufactured using 3D printing technique.

According to an embodiment, manufacturing the polymer resin panel using the mold may include dipping the mold in a polymer resin in liquid state, curing the polymer resin in liquid state using ultraviolet light or heat, and separating the cured polymer resin from the mold.

According to an embodiment, uniformly doping the polymer resin panel with the phosphors may include dipping the polymer resin panel in a phosphor solution, and drying the phosphor-doped polymer resin panel to evaporate a solvent.

According to an embodiment, the plurality of solar cells may convert a specific wavelength range of light in sunlight absorbed and emitted by the phosphors into electrical energy.

According to an embodiment, each of the plurality of solar cells may be in the form of a bifacial panel, and the light emitted from the phosphors may be incident on each side of the solar cells.

According to an embodiment, the plurality of solar cells may be arranged such that each side is parallel or perpendicular to an incident direction of the sunlight incident on the polymer resin panel.

According to an embodiment, the plurality of solar cells may be arranged such that each side is slanted with respect to an incident direction of the sunlight incident on the polymer resin panel, and two solar cells may be arranged such that each side faces each other at a slant.

Advantageous Effects

The luminescent solar concentrator (LSC) according to an embodiment of the present disclosure includes the polymer resin panel uniformly doped with phosphors. Accordingly, it is possible to greatly improve the transmittance and optical haze compared to the existing LSC with phosphors physically mixed or coated on the front side of the panel.

In addition, it is possible to greatly improve the light collection efficiency of the LSC through the arrangement structure of the solar cells embedded in the polymer resin panel. Accordingly, it is possible to provide transmission properties for use in windows and high electrical energy productivity.

According to an embodiment, the polymer resin panel may be manufactured with flexibility or rigidity according to the purpose of use, and thus can be widely applied to curved structures, for example, building windows, automobile glasses and greenhouse roofs.

BEST MODE

The following detailed description of the present disclosure is made with reference to the accompanying drawings, in which particular embodiments for practicing the present disclosure are shown for illustration purposes. These embodiments are described in sufficiently detail for those skilled in the art to practice the present disclosure. It should be understood that various embodiments of the present disclosure are different but do not need to be mutually exclusive. For example, particular shapes, structures and features described herein in connection with one embodiment can be embodied in other embodiment without departing from the spirit and scope of the present disclosure. It should be further understood that changes can be made to locations or arrangements of individual elements in each disclosed embodiment without departing from the spirit and scope of the present disclosure. Accordingly, the following detailed description is not intended to be taken in limiting senses, and the scope of the present disclosure, if appropriately described, is only defined by the appended claims along with the full scope of equivalents to which such claims are entitled.

Hereinafter, the exemplary embodiments of the present disclosure will be described in detail with reference to the accompanying drawings.

Figure 1:
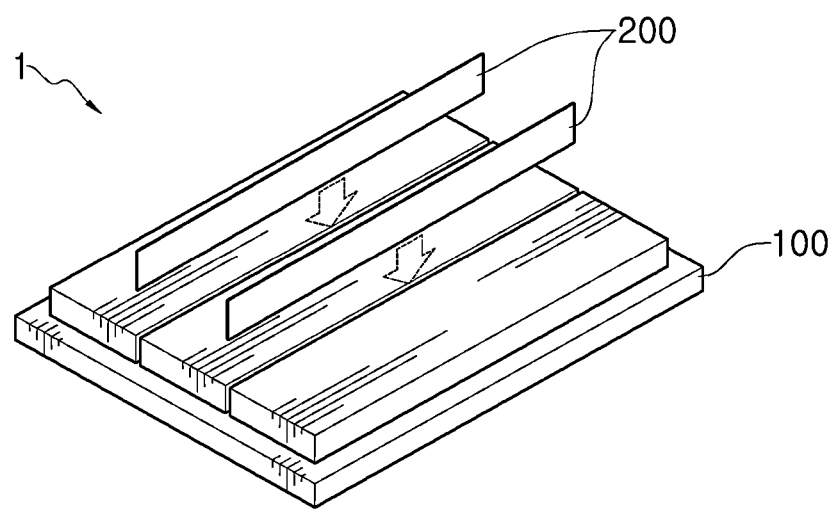
FIG. 1 shows a configuration of a luminescent solar concentrator (LSC) according to an embodiment.

FIG. 1 shows a configuration of a luminescent solar concentrator (LSC) according to an embodiment.

Referring to FIG. 1, the LSC 1 according to an embodiment includes a polymer resin panel 100 and a plurality of solar cells 200 embedded in the polymer resin panel 100.

The polymer resin panel 100 may be made of a transparent material (i.e., having visible transmittance) such as, for example, polydimethylsiloxane (PDMS). However, this is an example of the material of which the polymer resin panel is made, and an appropriate material may be selected according to the application field and the purpose of use of the LSC. For example, a variety of types of polymer materials including polycarbonates (PC), polyvinylpyrrolidone (PVP), polyimide (PI), poly(vinyl alcohol) (PVA), poly(lactic acid) (PLA), poly(methyl methacrylate) (PMMA) or a combination thereof may be used. The polymer resin panel 100 according to an embodiment may be manufactured with flexible properties by including a flexible material, and may be applied to curved structures, for example, automobile glasses and greenhouse roofs.

According to an embodiment, the polymer resin panel 100 is uniformly doped with phosphors. For example, the polymer resin panel may be doped by dipping in a phosphor solution and evaporating the solvent, but is not limited thereto. The phosphors may include a material that can absorb and emit light, for example, a quantum dot (QD) such as ZnO QD, CdS QD, CdSe QD, Mn:ZnSe QD, CuInS2/ZnS QD, Perovskite QD, Si QD, a nanocrystal such as NaYF4:Nd,Yb, YVO4:Er, NaYF4:Yb,Er, Y2O2S:Er, and an organic dye such as V570, Coumarin 6, Rhodamine 6G, Nile Red, DCM.

The existing LSC involves a transparent panel coated or mixed with phosphors on the front side by a physical method, and this method fails to uniformly dope or coat the phosphors, resulting in reduced light transmittance and increased optical haze. According to an embodiment of the present disclosure, phosphors are uniformly doped over the entire polymer resin panel, resulting in improved light transmittance and optical haze.

Figure 2A:
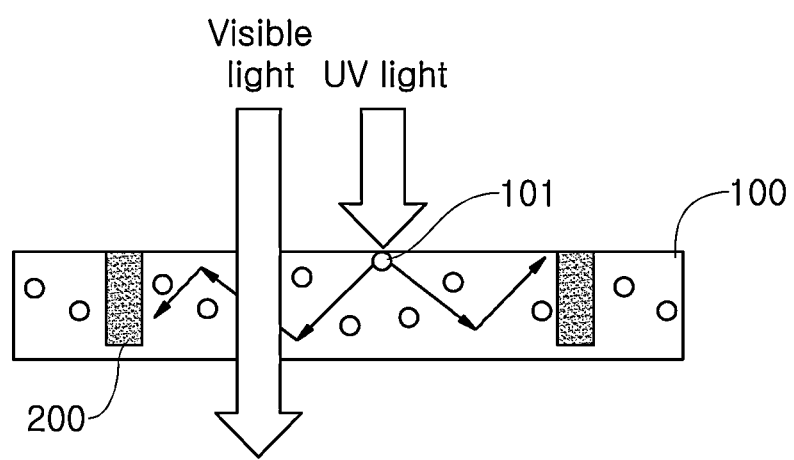
FIG. 2A shows a transmission process of solar energy to a solar cell in an LSC according to an embodiment.

FIG. 2A shows a transmission process of solar energy to the solar cell in the LSC according to an embodiment.

As shown in FIG. 2A, when sunlight is incident on the polymer resin panel 100, the phosphors 101 uniformly doped into the panel absorb and emit a wavelength range of light corresponding to a specific wavelength range of light (for example, ultraviolet (UV) light) in sunlight, and allow the remaining wavelength range of light (visible light and infrared light) to pass through. According to an embodiment, the polymer resin panel 100 and the phosphors 101 may function as a transparent window by allowing all wavelength ranges of light corresponding to visible light to pass through. The light emitted by UV absorption of the phosphors 101 travels along the waveguide formed in the polymer resin panel 100 and is transmitted to the solar cell 200.

Figure 2B:
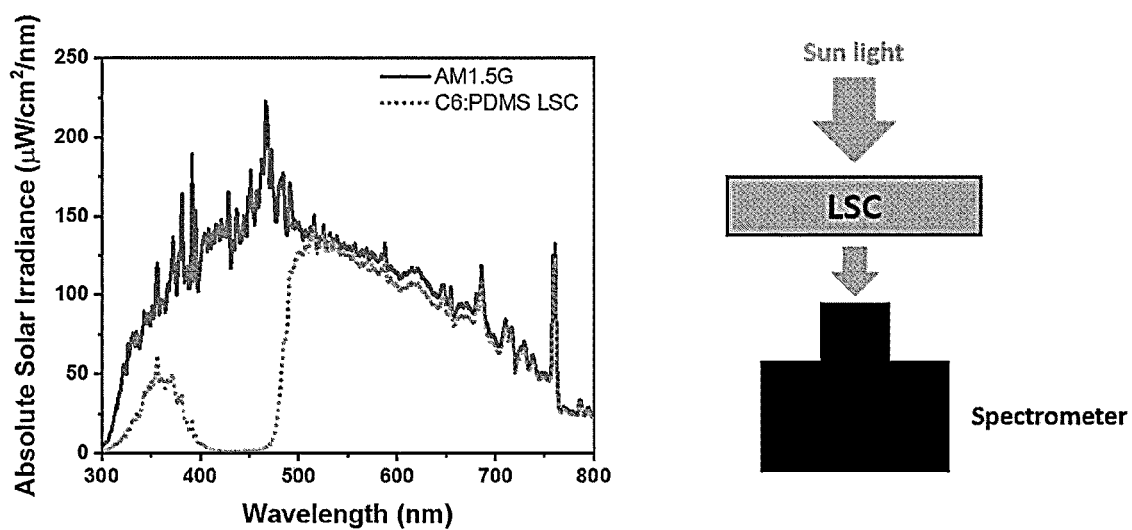
FIGS. 2B and 2C show absorption and emission spectra of a phosphor-doped LSC according to an embodiment.
Figure 2C:
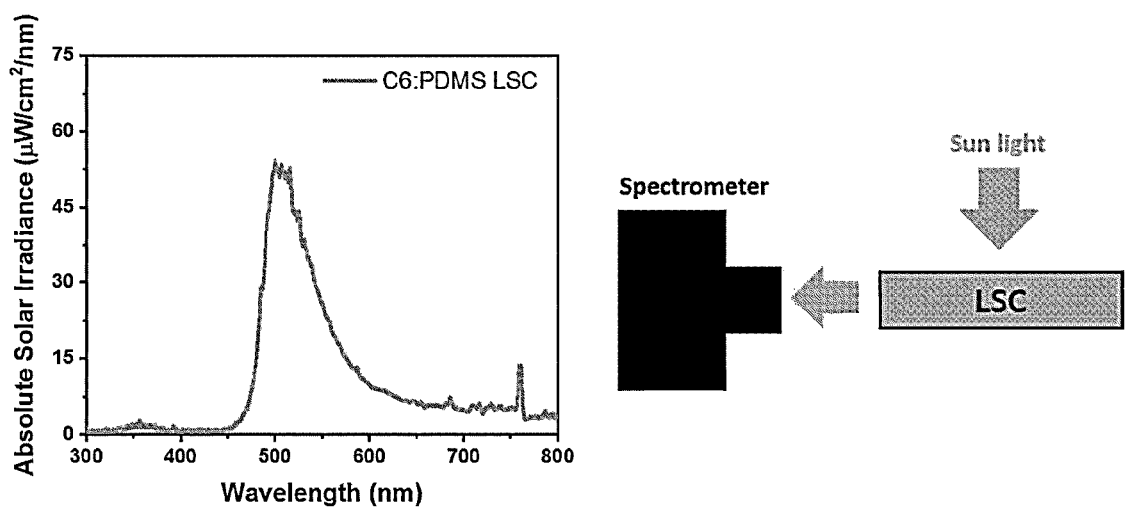

FIGS. 2B and 2C show absorption and emission spectra of the phosphor-doped LSC using a spectrometer.

In FIG. 2B, the spectrometer is positioned below the LSC to measure the spectrum of light passing through the LSC in sunlight. As shown, when sunlight is incident on the LSC, the LSC absorbs light between about 400-460 nm and allows the remaining wavelength range of light to pass through. In FIG. 2C, the spectrometer measures the spectrum of light emitted from the side of the LSC. As shown, light between about 500 and 600 nm is emitted from the side of the LSC. As such, the phosphor-doped LSC absorbs and emits a specific wavelength range of light and transmits light energy to the solar cells on the lateral sides through the waveguide.

The solar cell 200 converts the light into electrical energy using the photovoltaic effect. The term 'solar cell' as used herein should be understood as a concept including all photoelectric devices that can convert, into electrical energy, light emitted from phosphors by sunlight without directly using sunlight. The solar cell 200 may be made of a material such as, for example, c-Si, a-Si, GaAs, Perovskite, CIGS, CdTe and DSSC, but is not limited thereto.

Figure 3A:
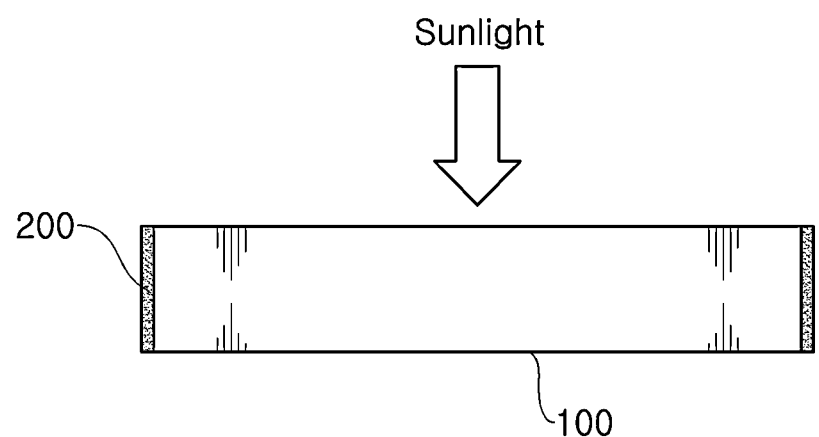
FIGS. 3A to 3D show different arrangement structures of solar cells in a polymer resin panel according to each embodiment.

According to an embodiment, the solar cell is attached to two ends of the polymer resin panel, and in this case, each solar cell may produce electrical energy using light incident on one side attached to the polymer resin panel. FIG. 3A shows a structure in which the solar cells 200 are attached to the two ends of the panel 100. According to this structure, compared to a structure in which bifacial solar cells are arranged at a predetermined interval, the light collection efficiency is lower, but the solar cells do not obstruct the field of view, thereby improving visibility.

According to another embodiment, each of the plurality of solar cells is in the form of a bifacial panel and light emitted from the phosphors is incident on each side of the solar cells. When the plurality of bifacial solar cells is arranged at a predetermined interval within the polymer resin panel, they receive light (i.e., light emitted from the phosphor) from the two sides, thereby improving the photoelectric conversion efficiency.

Figure 3B:
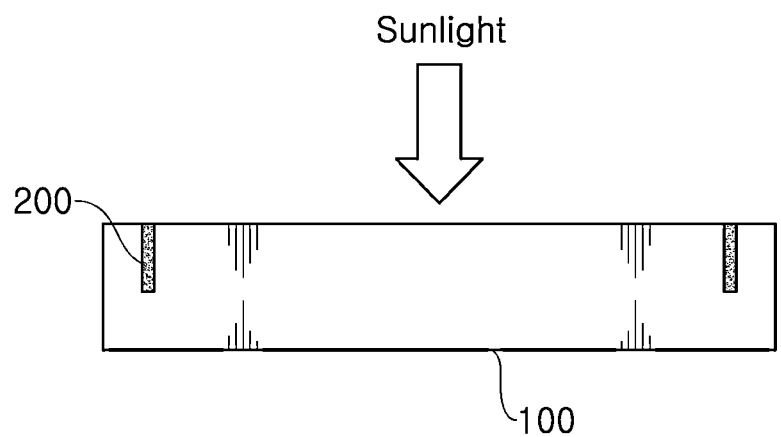
Figure 3C:
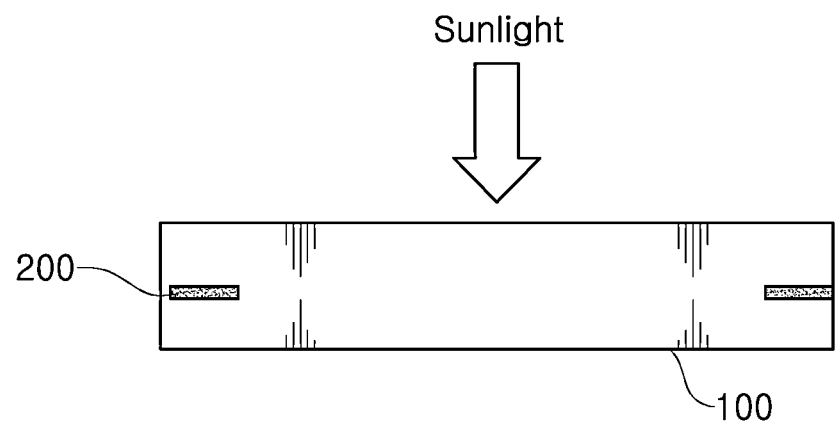
Figure 3D:
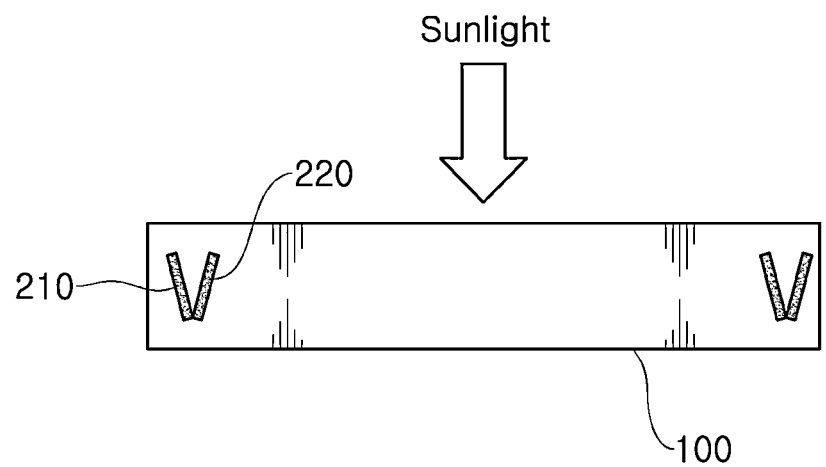

FIGS. 3B to 3D show different structures in which the solar cells are embedded in the polymer resin panel according to each embodiment.

FIG. 3B shows a structure in which the solar cells 200 in the form of a bifacial panel are arranged such that each side is parallel to the incident direction of sunlight according to an embodiment. According to this arrangement structure, it is possible not only to improve the photoelectric efficiency using the bifacial solar cells 200, but also to minimize the obstruction of field of view by the solar cells, thereby improving visibility of the LSC. Accordingly, it can be applied to building glass windows and automobile glass windows where it is necessary to maximize visibility.

FIG. 3C shows a structure in which the solar cells 200 in the form of a bifacial panel are arranged such that each side is perpendicular to the incident direction of sunlight according to an embodiment. According to this arrangement structure, compared to the structure of FIG. 3B, there is a disadvantage that the solar cells obstruct the field of view, but electrical energy is produced from light emitted from the phosphors as well as directly from incident sunlight, resulting in improved productivity. Accordingly, it can be efficiently used in applications where ensuring visibility is not so important, for example, outer walls or roofs of buildings, soundproof walls and soundproof tunnels.

FIG. 3D shows a structure in which solar cells 210, 220 in the form of a bifacial panel are arranged such that each side is slanted with respect to the incident direction of sunlight according to an embodiment. As shown, the two solar cells 210, 220 may be arranged such that each side faces each other at a slant. According to the "V"-shaped structure, in the similar way to the structure of FIG. 3C, it is possible to directly use sunlight incident on the panel, and some of light reflected by one solar cell 210 is transmitted to the other solar cell 220, thereby greatly improving the light collection efficiency. Further, it is possible to minimize the obstruction of field of view by adjusting the slope of the solar cells. The existing embed-type LSC (i.e., the solar cells are inserted into the substrate) needs to manufacture the solar cells at the micrometer scale to ensure the field of view, resulting in increased production cost and reduced light collection efficiency. In contrast, according to the structure of an embodiment, it is possible to minimize the obstruction of field of view without reducing the size of the solar cell, and ensure a desirable level of productivity.

Figure 4:
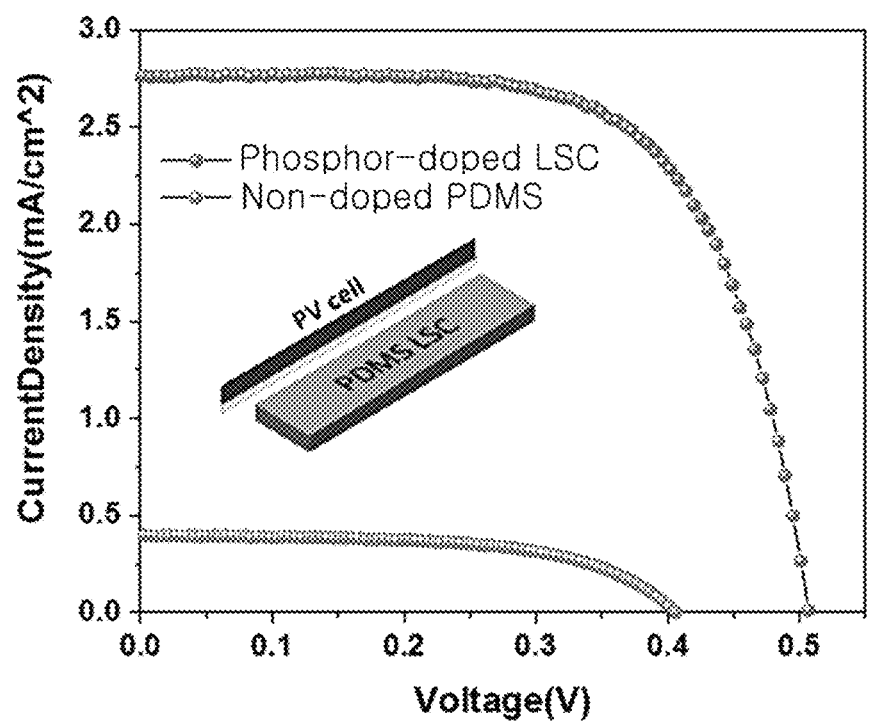
FIG. 4 shows a current-voltage curve of an LSC with a phosphor-doped polymer resin panel according to an embodiment.

FIG. 4 shows a current-voltage curve of the LSC with the phosphor-doped polymer resin panel according to an embodiment.

As can be seen from the graph of FIG. 4, under the condition of a predetermined intensity of solar radiation, an amount of current generated by the photoelectric effect in the LSC with the phosphor-doped polymer resin panel according to an embodiment is much larger than that of a non-doped PDMS. That is, it can be seen that the doped phosphors absorb sunlight and emit it and transmits light energy to the solar cells, thereby producing electrical energy.

Figure 5A:
FIGS. 5A and 5B show a comparison of transmission properties and optical haze between a conventional LSC module and an LSC module according to an embodiment.
Figure 5B:
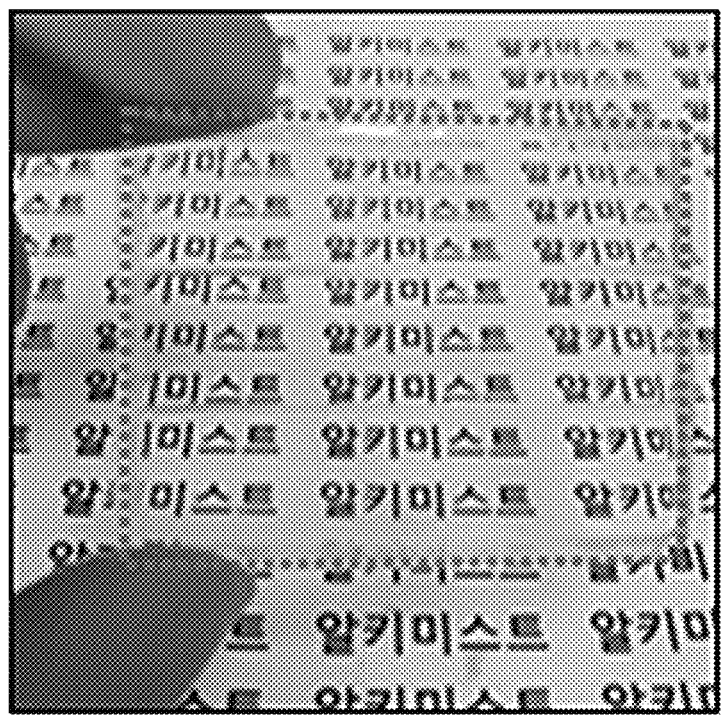

FIGS. 5A and 5B show a comparison of transmission properties and optical haze between the conventional LSC module and the LSC module according to an embodiment.

FIG. 5A shows an LSC module manufactured by physically mixing or coating a PDMS with phosphors (dyes), and as a result of measurement, the transmittance is about 85%, and the optical haze is about 43.9%. As shown, the letters behind the LSC module are obscurely seen. FIG. 5B shows an LSC module manufactured by uniformly doping with phosphors according to an embodiment of the present disclosure, and as a result of measurement, the transmittance is about 94%, and the optical haze is about 3%. As can be seen from a comparison between FIGS. 5A and 5B, the structure of an embodiment has a great improvement in the transmittance and optical haze.

Figure 6:
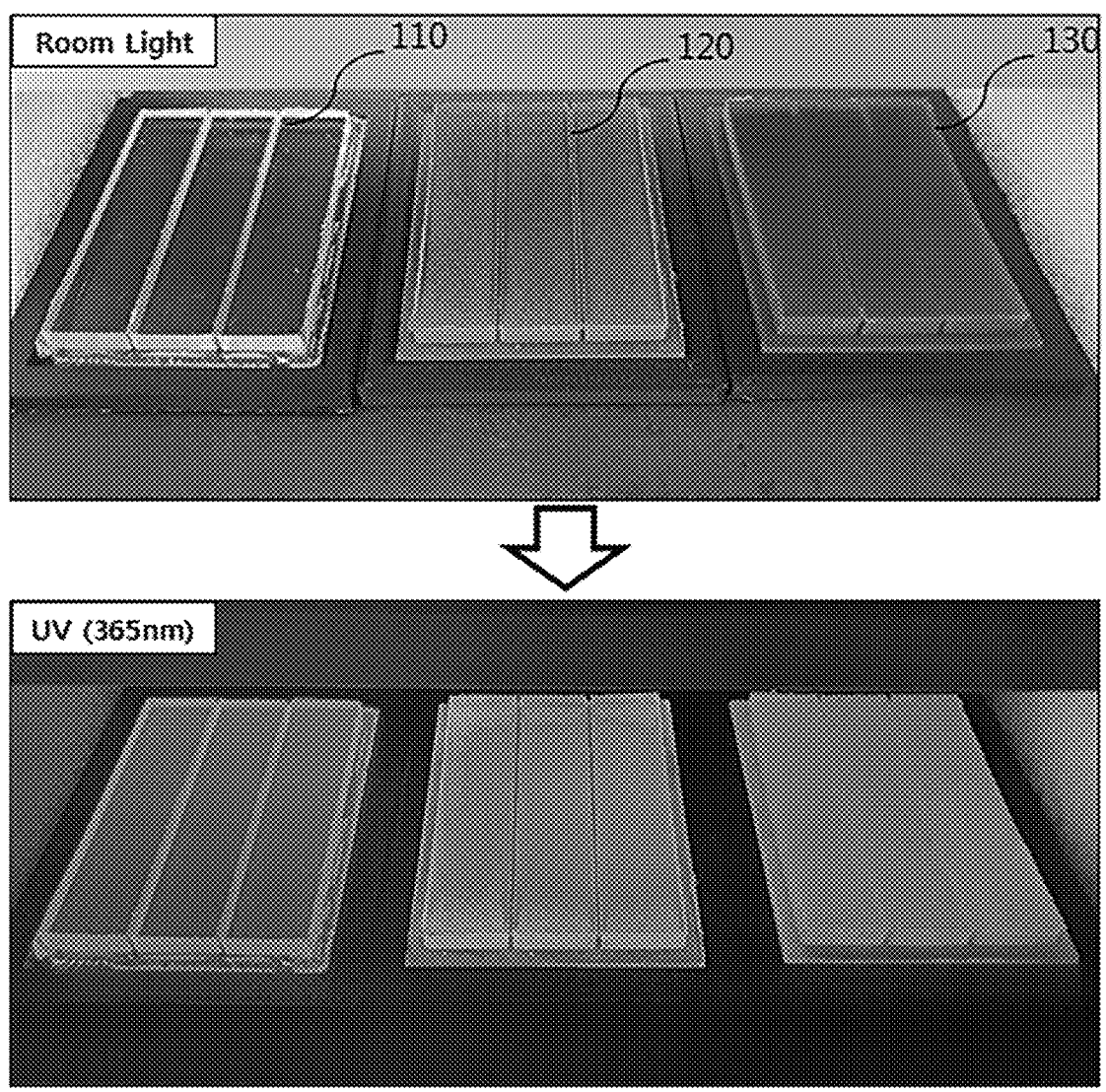
FIG. 6 shows LSC modules of different colors manufactured according to an embodiment.

FIG. 6 shows LSC modules of different colors manufactured according to an embodiment. Basically, the polymer resin panel and the phosphors of the present disclosure may be made of a transparent material that allows all wavelength ranges corresponding to visible light to pass through, but may be manufactured to realize a specific color by reflecting some wavelength ranges of light according to the application field and the purpose of use. The LSC modules 110, 120, 130 of FIG. 6 are doped with phosphors that can absorb the UV region of sunlight and emit blue, green and red light respectively.

Hereinafter, a method for manufacturing the LSC according to an embodiment will be described with reference to FIGS. 7A to 7F.

Figure 7A:
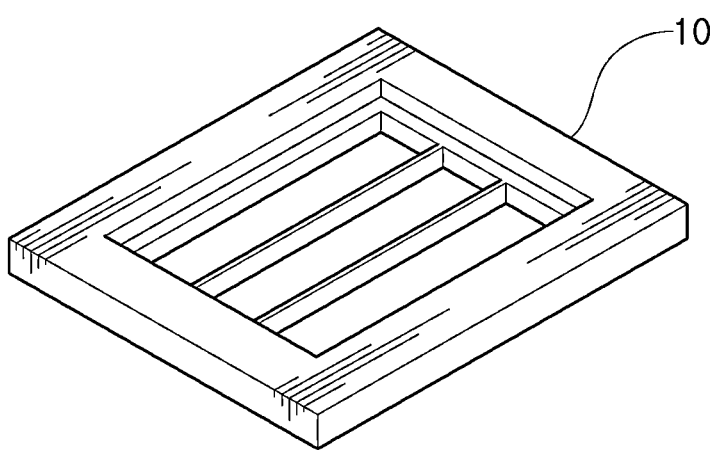
FIGS. 7A to 7F show a process of manufacturing an LSC according to an embodiment.

First, the step of manufacturing a mold 10 used to manufacture a polymer resin panel is performed. According to an embodiment, the mold 10 may be manufactured using a 3D printer or a forming die. An exemplary shape of the manufactured mold 10 is shown in FIG. 7A. According to an embodiment, the mold may be customized according to the type of insertion of solar cells. For example, LSCs in which solar cells are vertically inserted into a panel and LSCs in which solar cells are inserted into a panel in the shape of V may be manufactured by molds of different shapes.

Figure 7B:
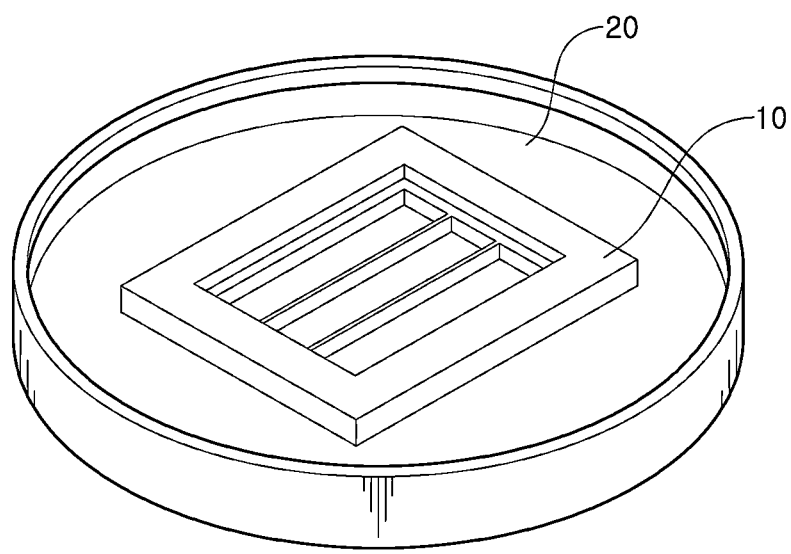
Figure 7C:
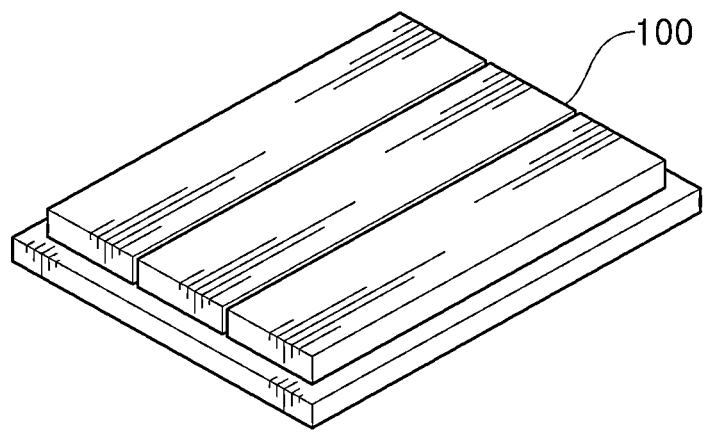

Subsequently, the step of manufacturing a polymer resin panel using the mold 10 is performed. As shown in FIG. 7B, the mold 10 manufactured in the previous step is dipped in a polymer resin 20 in liquid state, and the polymer resin 20 in liquid state is cured by UV radiation or heat. When the cured polymer resin is separated from the mold 10, the polymer resin panel 100 is completed as shown in FIG. 7C.

Figure 7D:
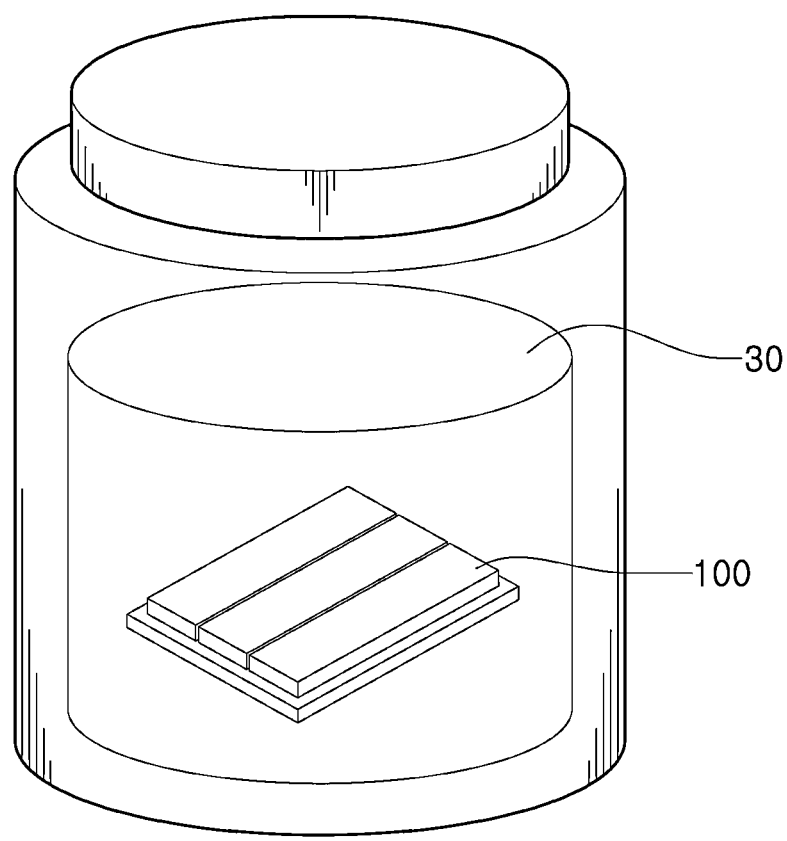
Figure 7E:
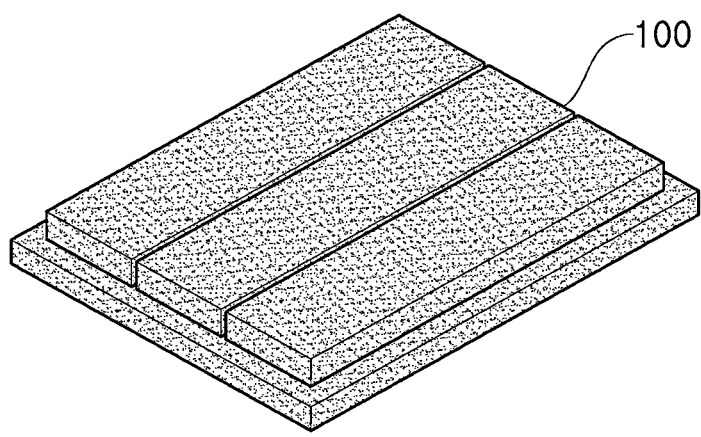

Subsequently, the step of uniformly doping the polymer resin panel 100 with phosphors is performed. As shown in FIG. 7D, the polymer resin panel 100 is dipped in a container containing a phosphor solution, followed by solvent evaporation. Immediately after taking from the phosphor solution, the shape of the panel may be deformed, but the shape is restored in the drying process. FIG. 7E shows the phosphor-doped polymer resin panel 100.

Figure 7F:
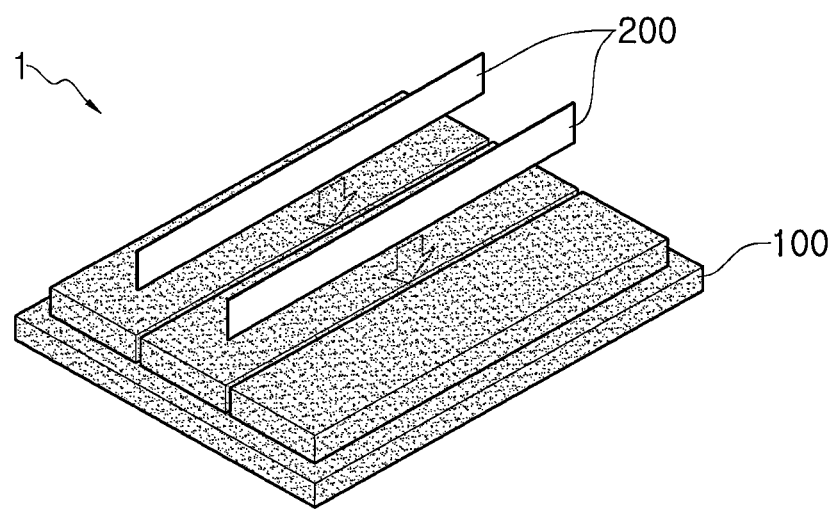

Finally, as shown in FIG. 7F, the step of arranging a plurality of solar cells 200 in the doped polymer resin panel 100 is performed. As described above, the molds 10 and the polymer resin panels 100 of different shapes may be used depending on the arrangement structure of the solar cells.

In the completed LSC 1, the phosphors doped into the polymer resin panel 100 absorb incident sunlight and emit it, and the emitted light is transmitted to the solar cells 200 along the waveguide. The solar cells 200 may convert incident light into electrical energy.

As described above, each solar cell may receive light through the edges attached to two ends of the polymer resin panel, or each bifacial solar cell may be inserted into the polymer resin panel and receive light from the two sides. According to embodiments, as described above, each solar cell may be arranged such that each side is parallel or perpendicular to the incident direction of sunlight incident on the polymer resin panel, or may be arranged with a V-shaped structure at a slant with respect to the incident direction of sunlight.

According to embodiments of the LSC as described hereinabove, it is possible to greatly improve the transmittance and optical haze compared to the existing LSC with phosphors physically mixed or coated on the front side of the panel, and it is possible to greatly improve the light collection efficiency of the LSC through the arrangement structure of the solar cells embedded in the polymer resin panel. Accordingly, it is possible to provide transmission properties for use in windows as well as high electrical energy productivity. Additionally, in an embodiment, the polymer resin panel may be manufactured with flexibility or rigidity according to the purpose of use, and thus can be widely applied to curved structures, for example, building windows, automobile glasses and greenhouse roofs.

While the present disclosure has been hereinabove described with reference to the embodiments, those skilled in the art will understand that various modifications and variations may be made thereto without departing from the spirit and scope of the present disclosure set forth in the appended claims.

The invention claimed is:

1. A luminescent solar concentrator, comprising:
   a polymer resin panel uniformly doped with phosphors; and
   a plurality of solar cells arranged within the polymer resin panel, wherein the plurality of solar cells is arranged such that each side is slanted with respect to an incident direction of the sunlight incident on the polymer resin panel, and
   wherein the plurality of solar cells comprises pairs of adjacent solar cells facing each other at a slant to form a V-shaped structure.

2. The luminescent solar concentrator according to claim 1, wherein the phosphors allow a first wavelength range of light to pass through, and absorb and emit a second wavelength range of light when sunlight is incident on the polymer resin panel.

3. The luminescent solar concentrator according to claim 2, wherein the first wavelength range includes at least a wavelength range corresponding to visible light, and
   the second wavelength range includes at least a wavelength range corresponding to ultraviolet light.

4. The luminescent solar concentrator according to claim 3, wherein the first wavelength range includes all wavelength ranges corresponding to visible light, and the polymer resin panel is transparent.

5. The luminescent solar concentrator according to claim 2, wherein the plurality of solar cells converts the second wavelength range of light absorbed and emitted by the phosphors into electrical energy.

6. The luminescent solar concentrator according to claim 5, wherein each of the plurality of solar cells is in the form of a bifacial panel, and the light emitted from the phosphors is incident on each side of the solar cells.

7. The luminescent solar concentrator according to claim 2, wherein the phosphors include at least one material of a quantum dot, a nanocrystal or a dye that absorbs and emits ultraviolet light.

8. The luminescent solar concentrator according to claim 1, wherein the polymer resin panel is flexible by including a flexible material.

9. A window comprising the luminescent solar concentrator according to claim 1 to produce electrical energy from outdoor sunlight.

10. A method for manufacturing a luminescent solar concentrator, comprising:
    manufacturing a mold;
    manufacturing a polymer resin panel using the mold;
    uniformly doping the polymer resin panel with phosphors; and
    arranging a plurality of solar cells within the polymer resin panel, wherein the plurality of solar cells comprises pairs of adjacent solar cells facing each other at a slant to form a V-shaped structure.

11. The method for manufacturing a luminescent solar concentrator according to claim 10, wherein the mold is manufactured using 3D printing technique.

12. The method for manufacturing a luminescent solar concentrator according to claim 10, wherein manufacturing the polymer resin panel using the mold comprises:
    dipping the mold in a polymer resin in liquid state;
    curing the polymer resin in liquid state using ultraviolet light or heat; and
    separating the cured polymer resin from the mold.

13. The method for manufacturing a luminescent solar concentrator according to claim 10, wherein uniformly doping the polymer resin panel with the phosphors comprises:

dipping the polymer resin panel in a phosphor solution; and drying the phosphor-doped polymer resin panel to evaporate a solvent.

14. The method for manufacturing a luminescent solar concentrator according to claim 10, wherein the plurality of solar cells converts a specific wavelength range of light in sunlight absorbed and emitted by the phosphors into electrical energy.

15. The method for manufacturing a luminescent solar concentrator according to claim 14, wherein each of the plurality of solar cells is in the form of a bifacial panel, and the light emitted from the phosphors is incident on each side of the solar cells.

* * * * *

UNITED STATES PATENT AND TRADEMARK OFFICE
CERTIFICATE OF CORRECTION

PATENT NO. : 11,949,372 B2
APPLICATION NO. : 17/056412
DATED : April 2, 2024
INVENTOR(S) : Gumin Kang et al.

It is certified that error appears in the above-identified patent and that said Letters Patent is hereby corrected as shown below:

On the Title Page

Item (54) and in the Specification, Column 1, Lines 1-3, Please amend the title from 'LUMINESCENT SOLAL CONCENTRATOR WITH PHOSPHOR-DOPED POLYMER RESIN' to 'LUMINESCENT SOLAR CONCENTRATOR WITH PHOSPHOR-DOPED POLYMER RESIN'.

Signed and Sealed this
Fifth Day of November, 2024

Katherine Kelly Vidal
*Director of the United States Patent and Trademark Office*